United States Patent [19]

Nishikubo et al.

[11] 3,980,483

[45] Sept. 14, 1976

[54] PHOTOCURABLE COMPOSITION

[75] Inventors: Tadatomi Nishikubo; Shinzi Ugai; Taro Ichijo; Masahiko Kishida, all of Fujisawa, Japan

[73] Assignee: Nippon Oil Seal Industry Co., Ltd., Tokyo, Japan

[22] Filed: May 7, 1975

[21] Appl. No.: 575,426

Related U.S. Application Data

[63] Continuation of Ser. No. 352,752, April 18, 1973, abandoned.

[30] Foreign Application Priority Data

Apr. 24, 1972 Japan.............................. 47-40377

[52] U.S. Cl............................. 96/115 R; 96/115 P; 204/159.15; 260/836; 260/837 R
[51] Int. Cl.²........................ G03C 1/58; C08F 8/00
[58] Field of Search...................... 96/115 P, 115 R; 204/159.15; 260/836 R, 837 R

[56] References Cited

UNITED STATES PATENTS

| | | | |
|---|---|---|---|
| 3,256,226 | 6/1966 | Fekete et al. | 260/23.5 |
| 3,450,613 | 6/1969 | Steinberg | 260/836 R |
| 3,876,432 | 4/1975 | Carlick et al. | 96/115 P |

*Primary Examiner*—Jack P. Brammer
*Attorney, Agent, or Firm*—Holman & Stern

[57] ABSTRACT

A photocurable composition comprising the reaction product of the addition compound obtained from an epoxy resin and a photopolymerizable $\alpha\beta$-unsaturated carboxylic acid, and a dibasic acid anhydride; a photopolymerizable monomer; and a photopolymerization initiator. The composition is used for making a relief image.

16 Claims, No Drawings

PHOTOCURABLE COMPOSITION

This is a continuation of application Ser. No. 352,752 filed Apr. 18, 1973, now abandoned.

This invention relates to a photocurable composition, more particularly, a photocurable composition comprising the derivative of the addition compound of an epoxy resin and a photopolymerizable α,β-unsaturated carboxylic acid, a photopolymerizable monomer, and a photopolymerization initiator.

A photocurable cement composition comprising the addition compound of an epoxy resin and acrylic or methacrylic acid, and a specific photopolymerization initiator is described in U.S. Pat. No. 3,450,613, issued June 17, 1969 to Israel Steinberg. It was later found that a photocuring reaction is unexpectedly promoted by adding acrylic or methacrylic acid ester to the composition, this discovery being the subject matter of commonly assigned, copending Application, Ser. No. 269,184, now abandoned which is embodied herein in its entirety by reference.

When it is desired to obtain a relief image from such a photocurable composition, the photocurable composition is exposed through a negative film thereon, and an unexposed area of the photocurable composition is then washed out by using a developer such as an aqueous alkaline solution and an organic solvent. Therefore, the uncured composition itself must be soluble in these developers. But, the above mentioned photo-curable composition is insoluble in the aqueous alkaline solution or the general organic solvent, and cannot be developed by these developers. Thus, it is difficult to obtain the relief image which is proposed from the prior art compositions.

It has now been found that photocurable compositions which can give relief images by developing in an aqueous alkaline solution or a common organic solvent, can be made by reacting the addition compound of an epoxy resin and a photopolymerizable α,β-unsaturated carboxylic acid used as an ingredient of the above photocurable composition with a dibasic carboxylic acid anhydride. Therefore, this invention relates to a photocurable composition comprising: (A) the reaction product of the addition compound obtained from an epoxy resin and a photopolymerizable α,β-unsaturated carboxylic acid, and a dibasic anhydride; (B) a photopolymerizable monomer; and (C) a photopolymerization initiator.

The addition compound of an epoxy resin and a photopolymerizable α,β-unsaturated carboxylic acid is obtained from the epoxy resin, such as the reaction product of 2,2-bis (p-hydroxyphenyl) propane (Bisphenol A) and epichlorohydrin, the reaction product of polypropyleneglycohl and epichlorohydrin or the reaction product prepared by epoxidizing an aliphatic or an alicyclic olefin, and a photopolymerizable α,β-unsaturated carboxylic acid such as acrylic acid, methacrylic acid, crotonic acid, and sorbic acid. This addition compound has free hydroxy groups in its side chains caused by ring cleavages of epoxy groups. These hydroxy groups in the addition compound are esterified by a dibasic carboxylic acid anhydride, and the esterification reaction product is used as an ingredient of the photocurable composition according to this invention. When the obtained composition is used for forming a relief image, it is preferable, in the above esterification reaction, to use an amount of the acid anhydride of from 0.5 to 1.0 in the ratio of acid anhydride gram equivalent to hydroxy group gram equivalent. When an amount of the acid anhydride of less than 0.5 is used, the numbers of the free carboxyl groups in the obtained esterification reaction product are insufficient and it becomes difficult to develop the exposed area of the composition by an aqueous alkaline solution and a general organic solvent such as an alcohol. Exemplary dibasic carboxylic acid anhydrides are succinic acid anhydride, maleic acid anhydride, citraconic acid anhydride, phthalic acid anhydride, trimellitic acid anhydride, pyromellitic acid anhydride, chlorendic acid anhydride, etc. From the point of view of development, anhydrides having relatively low molecular weight are preferable. Similarly, epoxy resins having relatively low molecular weight are preferable. Further, in this invention, an epoxy resin having epoxy group gram equivalents of not more than 1000 are preferable, and when several kinds of epoxy resin are used in the form of mixture, the mean epoxy group gram equivalents of the mixture of not more than 1000 are preferable.

As photopolymerizable monomers, mono- or polyfunctional acrylates are preferred. When poly-functional acrylates are used, the curing reaction of the photocurable composition is remarkably promoted. For examples of these photopolymerizable monomers, hydroxyalkyl acrylate, mono- or poly-alkylenglycol diacrylate, trimethylolpropane triacrylate, and corresponding methacrylates can be given. As other photopolymerizable monomers, acrylamides and the derivatives thereof such as n-butoxymethylol acrylamide, N-vinylpyrrolidone, vinylacetates, styrene, and α,β-unsaturated carboxylic acid esters of maleic acid, crotonic acid, sorbic acid, itaconic acid, etc. can be used. And using an amount of the photopolymerizable monomer of from 5 to 70% by weight of the photocurable composition is generally preferable.

The curable ingredients in the photocurable composition according to this invention are obtained through the following two processes. That is to say, as the first step, an addition reaction product is obtained by the addition reaction of an epoxy resin and an α,β-unsaturated carboxylic acid, preferably in the presence of a catalyst such as methyltriethylammonium iodide and triethyl amine and a thermal polymerization inhibitor such as hydroquinone monoethylether, hydroquinone, anthraquinone, cupterron, di-tert-buthylcatechol, phenothiazine, copper oxide and copper naphthenate also preferably in a photopolymerizable monomer as a solvent, and then, as the second step, the curable ingredients are prepared by reacting the obtained addition reaction product with a dibasic acid anhydride, preferably in a photopolymerizable monomer solvent. Wherein, using an amount of the catalyst of 0.01 – 10% by weight of the obtained curable ingredients is preferable, and also using an amount of the inhibitor of about 0.01 – 5.0% by weight of the obtained curable ingredient is preferable. Both reactions may also be carried out in a solvent such as a ketone or a saturated carboxylic acid ester, but in this case, the reaction mixture has to be poured into a bed solvent such as n-hexane, or similar solvent in which the product is insoluble, to precipitate and to isolate the reaction product.

Photopolymerization initiators conventionally used in the art such as benzophenone, acetophenone, triphenylphosphine, 2-ethyl anthraquinone, 2-tert-butyl anthraquinone, furoin, benzoin, benzoin methylether, benzoin ethylether, benzoin phenylether, benzoin acetate and decyl chloride are added to the curable ingredients, and the photocurable composition is completed. An amount of the photopolymerization initiator is generally from about 0.2 to about 5.0% by weight of the curable ingredients, in the photocurable composition, but when a coloring agent is added to the composition, an amount of the initiator of from about 7 to 15% by weight of the curable ingredients is preferable.

Ths photocurable composition according to this invention is very stable even when the composition includes the photopolymerization initiator. Although the stability of the composition may differ according to the kind of photocurable ingredients thereof, the composition is generally stable over 1 year under shielding from light at room temperature.

A viscosity of these liquid photocurable compositions of from about 10 to about 800 poises at 25°C is preferable, with viscosity control being obtained by controlling the relative amount of the photopolymerizable monomers.

The photocurable compositions according to this invention not only are rapidly cured by exposing to light, generally to ultra violet rays, but also give easily clear relief images by washing out unexposed areas by the use of developers such as an aqueous alkaline solution, methanol, methylethylketone and acetone when the compositions are exposed to light through a negative film thereon, are exposed to light through a polyester film and a negative film on the film. After peeling the negative film and the polyester film, the treatment of washing out unexposed areas is commenced. In the case of a transparent support, the compositions coated on the support can be exposed through the support with the negative film which is placed on the opposite surface of the support. Light having a wave length of from about 250 to about 450 m$\mu$ is used for exposure.

Further, photocurable compositions according to this invention can be also used a paints, varnishes, printing inks, etc., by adding coloring agents. Also in this case, the cure is comparatively rapidly carried out. When the photocurable composition according to this invention is used for such purposes, an amount of the acid anhydride of more than 0.02 in the ratio of acid anhydride gram equivalent to hydroxy group gram equivalent is preferable from this standpoint of thermostability of the obtained composition. Furthermore, since the compositions exhibit good adhesive properties, the compositions can not only be used as an adhesive, but also, in the case of forming relief images, give good adhesion of the obtained images with the support.

The present invention is further illustrated by the following examples.

EXAMPLE 1

130 g. of epoxy resin prepared from Bisphenol A with epichlorohydrin (Dow Chemical Company; DER-337, epoxy group gram equivalents of 260) and 36 g of acrylic acid (0.5 mole) were reacted in 260 g. of triethyleneglycol diacrylate, in the presence of 2 g. of methyltriethyl ammonium iodide and 0.3 g. of hydroquinone monomethylether, at 90°C for 8 hours. After the reaction mixture was cooled to 50°C, 186 g. (0.5 mole) of chlorendic acid anhydride was added to the mixture, and then the mixture was reacted at 80°C for 3 hours. The solution of the reaction product having a viscosity of 280 poises at 25°C was obtained.

EXAMPLE 2

A photocurable composition was prepared by adding 0.2 wt. part of benzoin ethyl ether to 10 wt. parts of the solution of the reaction product of Example 1, and a portion of the composition was coated on a copper sheet to give a film thickness of 300$\mu$. Then the composition on the copper sheet was exposed to a 500 Watt high pressure mercury lamp (Ushio Electric Inc.; USH-500D) at a distance of 30cm.. The composition needed about 0.5 second as the curing time.

Further, another portion of the composition was coated on a tin plate to give a film thickness of about 2 mm., a polyester film was laminated on the coated composition, and a negative film was placed on the polyester film. Then the composition was exposed to a 40W chemical lamp at a distance of 10cm. for 3 minutes through the polyester film and the negative film. After the exposure, the polyester film and the negative film were peeled off and the exposed area of the composition was developed by using methanol for 2 minutes. As a result, a relief image was obtained on the tin plate.

EXAMPLE 3

A photocurable composition was prepared by adding 0.5 wt. part of benzoinethylether and a coloring agent to 7.5 wt. parts of the solution of the reaction product from Example 1 and the composition was coated on a tin plate to give a film thickness of about 0.1 mm.. Then the composition was exposed to a 500 watt high pressure mercury lamp at a distance of 30 cm. and the curing time was measured. When 2 wt. parts of carmine lake, victoria blue and hanza yellow were used independently as the coloring agent, the curing time was about 1.0 second. And when 1 wt. part of carbon black was used, the curing time was about 2.0 seconds.

The above-mentioned photocurable composition containing 2 wt. parts of carmine lake was coated on the end of one thin sheet of glass of 1 cm. width, and another thin sheet of the same size was placed over the length of 1cm. on the end of the first sheet. Then these were exposed to a 500 watt high pressure mercury lamp at a distance of 30 cm. for 2 seconds. As a result, the two sheets firmly adhered to each other to the extent that two sheets did not easily peel off each other by pulling them from both sides longitudinally by hand.

EXAMPLE 4

110 g. of epoxy resin (3,4-epoxy-6-methylcyclohexylmethyl-3,4-epoxy-6-methylcyclohexylmethyladipate) (Chisso Corp.; Chissonox CX-289, epoxy gram equivalents of 220) and 36 g. of acrylic acid (0.5 mole) were reacted in 250 g. of nonaethyleneglycol diacrylate, in the present of 0.3% of hydroquinone monomethylether and 1.0 g. of methyltriethyl ammonium iodide at 100°C for 5 hours. After the reaction mixture was cooled to 50°C, 74 g. (0.5 mole) of phthalic acid anhydride was added to the mixture, and then the mixture was reacted at 80°C for 2 hours. The solution of the reaction product having a viscosity of 87 poises at 25°C was obtained.

EXAMPLE 5

A photocurable composition was prepared by adding 0.4 wt. part of decyl chloride to 20 wt. parts of the solution of the reaction product of Example 4 and a portion of the composition was exposed by using a high pressure mercury lamp in the same manner as shown in Example 2. The composition needed about 1.2 seconds as the curing time.

Another portion of this composition was coated on a tin plate to give a film thickness of about 1mm., a polyester film was laminated on the coated composition, and a negative film was placed on the polyester film. Then the composition was exposed to a 40W chemical lamp at a distance of 10 cm. for 3 minutes through the polyester film and the negative film. After the exposure, the polyester film and the negative film were peeled off and the exposed area of the composition was developed by using a 5% aqueous solution of sodium hydroxide for 2 minutes. As a result, a relief image was obtained on the tin plate.

EXAMPLE 6

110 g. of epoxy resin (3,4-epoxy-6-methylcyclohexylmethyl-3,4-epoxy-6-methylcyclohexylmethyladipate) (Chissonox CX-289) and 36 g. of methacrylic acid were reacted in the presence of 0.3 g. of hydroquinone monomethylether and 1.0 g. of methyltriethylammonium iodide at 100°C for 3 hours. After the reaction the mixture was cooled to 50°C, 250 g. of n-butoxymethylol acrylamide and 40 g. (0.5 mole) of maleic acid anhydride were added to the mixture, and then the mixture was reacted at 50°C for 5 hours. A solution of reaction product having a viscosity of 58 poises at 25°C was obtained.

EXAMPLE 7

A photocurable composition was prepared by using the solution of the reaction product of Example 6 in the same manner as shown in Example 2, and the composition was exposed to a 500W high pressure mercury lamp in the same manner as shown in Example 2. The curing time was about 1.5 seconds.

EXAMPLE 8

Another photocurable composition was prepared by adding 0.4 wt. part of 2-ethyl anthraquinone to 20 wt. parts of the solution of the reaction product of Example 6, and then this composition was coated on a glass sheet to give a film thickness of about 2 mm.. A polyester film was laminated on the coated composition and a negative film was placed on the polyester film. Then the composition was exposed to a 40 W chemical lamp at a distance of 10 cm. for 3 minutes through the polyester film and the negative film. After the exposure, the polyester film and the negative film were peeled and the exposed area of the composition was developed by using 5% aqueous solution of sodium hydroxide for 2 minutes. As a result, a relief image was obtained on the glass sheet.

EXAMPLE 9

130 g. of epoxy resin prepared from Bisphenol A with epichlorohydrin (DER-337) and 43 g. of (0.5 mole) of crotonic acid was reacted in 280 g. of triethyleneglycol diacrylate, in the presence of 2 g. of sodium benzoate and 0.1 g. of hydroquinone monomethylether at 100°C for 5 hours. After the reaction mixture was cooled to 50°C, 186 g. (0.5 mole) of chlorendic acid anhydride was added to the mixture, and the mixture was reacted at 80°C for 2 hours. A solution of the reaction product having a viscosity of 265 poises at 25°C was obtained.

EXAMPLE 10

A photocurable composition was prepared by adding 0.2 wt. part of benzoin buthylether and 0.01 wt. part of hydroquinone monomethylether to 10 wt. parts of the solution of the reaction product of Example 9, and the composition was coated on a tin plate to give a film thickness of about 1 mm.. A polyester film was laminated on the coated composition and a negative film was placed on the polyester film. Then the composition was exposed to a 3 KW. mercury lamp at a distance of 30 cm. for 30 seconds. After the exposure, the polyester film and the negative film were peeled and the exposed area of the composition was developed by using methanol for 2 minutes. As a result, a relief image was obtained on the tin plate.

EXAMPLE 11

130 g. of epoxy resin (DER-337) and 36 g. (0.5 mole) of acrylic acid were reacted in 250 g. of triethyleneglycol diacrylate, in the presence of 0.3 g. of hydroquinone monomethylether and 2 g. of methyltriethylammonium iodide at 100–120°C for 3 hours. After the reaction, 93 g. (0.25 mole) of chlorendic acid anhydride was added and the mixture was reacted at 100°–120°C for 2 hours. A solution of the reaction product having a viscosity of 75 poise at 25°C was obtained.

EXAMPLE 12

A photocurable composition was prepared by adding 9 g. of benzoin-n-buthylether to the solution of the reaction product of Example 11, and a portion of the composition was coated on a copper sheet to give a film thickness of about 1 mm. Then the composition on the copper sheet was exposed to a 500 watt high pressure mercury lamp at a distance of 30 cm.. The curing time was about 0.5 second.

Another portion of the composition was allowed to stand under shielding from light at room temperature for twelve months, but did not gel. And, both viscosity and curing time of the composition, at that time, were almost same as those shown at 12 months before.

EXAMPLE 13

186 g. of epoxy resin (90% by weight of diglycidylether of Bisphenol A, 10% by weight of butylglycidylether) (Dow Chemical Co.; DER-334, epoxy group gram equivalents of 186) and 72 g. (1 mole) of acrylic acid were reacted in the presence of 2 g. of triethylbenzyl ammonium chloride and 0.3 g. of hydroquinone monomethylether at 100°–120°C for 2 hours. After the reaction, 100 g. of trimethylolpropane triacrylate and 80 g. (0.8 mole) of succinic acid anhydride were added to the reaction mixture, and the mixture was reacted at 100°C for 2 hours. A solution of the reaction product having a viscosity of 820 poise at 25°C was obtained.

EXAMPLE 14

A photocurable composition was prepared by adding 7 g. of benzoinethylether to the solution of the reaction product of Example 13, and the composition was exposed in the same manner as shown in Example 12. The curing time was about 0.5 second.

The above mentioned photocurable composition was allowed to stand under shielding the light at room temperature for eight months, but did not gel. And, both viscosity and curing time of the composition, at that time, were almost the same as those shown at 8 months before.

What is claimed is:

1. A photocurable composition comprising:
   A. the free carboxylic group-containing esterification reaction product of
      1. the addition compound of an epoxy resin and a photo-polymerizable α,β-unsaturated carboxylic acid, and
      2. a dibasic carboxylic acid anhydride,
   wherein the hydroxy groups formed by ring cleavages of epoxy groups in said addition compound have been esterified by said dibasic carboxylic acid anyhdride;
   B. a photopolymerizable ethylenically unsaturated monomer; and
   C. a photopolymerization initiator selected from the group consisting of benzophenone, acetophenone, triphenylphosphine, 2-ethyl anthraquinone, 2-tert-butyl anthraquinone, furoin, benzoin, benzoin methylether, benzoin ethylether, benzoin phenylether, benzoin acetate and decyl chloride.

2. A composition as defined in claim 1, wherein said photopolymerizable, α,β-unsaturated acid is selected from the group consisting of acrylic acid, methacrylic acid, crotonic acid, and sorbic acid.

3. A composition as defined in claim 1, wherein said dibasic acid anhydride is selected from the group consisting of succinic acid anhydride, maleic acid anhydride, citraconic acid anhydride, phthalic acid anhydride, trimellitic acid anhydride, pyromellitic acid anhydride, and chlorendic acid anhydride.

4. A composition as defined in claim 1, wherein said epoxy resin has an epoxy group gram equivalent of not more than about 1000.

5. A composition as defined in claim 1, wherein said photopolymerizable monomer is selected from the group consisting of acrylates, methacrylates, acrylamides, N-vinylpyrolidone, vinyl acetates, styrene, and α,β-unsaturated carboxylic acid esters of maleic acid, crotonic acid, sorbic acid and itaconic acid.

6. A composition as defined in claim 1, wherein said photopolymerizable ethylenically unsaturated monomer is present in an amount of from about 5 to about 70 percent by weight of said composition.

7. A composition as defined in claim 1, wherein said photopolymerization initiator is present in an amount of from about 0.2 to about 15.0 percent by weight of said composition.

8. A composition as defined in claim 6, wherein said photopolymerizable initiator is present in an amount of from about 0.2 to about 5.0 percent by weight of said composition.

9. A composition as defined in claim 6, further comprising a coloring agent and wherein said photopolymerization initiator is present in an amount of from about 7 to about 15 percent by weight of said composition.

10. A composition as defined in claim 1, wherein said composition is in liquid form and has a viscosity of from about 10 to about 800 poises at 25°C.

11. A composition as defined in claim 1, wherein said addition compound has free hydroxy groups in its side chains and the ratio of acid anhydride gram equivalents to hydroxy group gram equivalents is greater than about 0.02.

12. A composition as defined in claim 11, wherein said ratio is from about 0.5 to about 1.0.

13. A method of preparing a photocurable composition which comprises the steps of:
   A. reacting an epoxy resin with an α,β-unsaturated carboxylic acid to obtain an addition compound;
   B. reacting said addition compound with a dibasic carboxylic acid anhydride whereby the hydroxy groups formed by ring cleavages of epoxy groups in said addition compound are esterified by said dibasic carboxylic acid anhydride to form an esterification reaction product containing free carboxylic groups;
   C. adding a photopolymerizable ethylenically unsaturated monomer; and
   D. adding a photopolymerization initiator selected from the group consisting of benzophenone, acetophenone, triphenylphosphine, 2-ethyl anthraquinone, 2-tert-butyl anthraquinone, furoin, benzoin, benzoin methylether, benzoin ethylether, benzoin phenylether, benzoin acetate and decyl chloride.

14. A method as defined in claim 12, wherein said reactions are carried out in a solvent comprising said monomer.

15. A method as defined in claim 13, wherein said addition reaction is performed in the presence of a catalyst and a thermal polymerization inhibitor.

16. A method as defined in claim 14, wherein said catalyst is used in an amount of from about 0.01 to about 10 percent by weight of said composition and said inhibitor is used in an amount of from about 0.01 to about 5 percent by weight of said composition.

* * * * *